(12) United States Patent
Nonaka

(10) Patent No.: US 9,412,627 B2
(45) Date of Patent: Aug. 9, 2016

(54) LIQUID PROCESSING METHOD AND LIQUID PROCESSING APPARATUS

(75) Inventor: Jun Nonaka, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1127 days.

(21) Appl. No.: 13/443,057

(22) Filed: Apr. 10, 2012

(65) Prior Publication Data

US 2012/0260952 A1    Oct. 18, 2012

(30) Foreign Application Priority Data

Apr. 12, 2011 (JP) ................................. 2011-088370

(51) Int. Cl.
*B08B 3/04* (2006.01)
*H01L 21/67* (2006.01)
*H01L 21/02* (2006.01)

(52) U.S. Cl.
CPC .... *H01L 21/67034* (2013.01); *H01L 21/02052* (2013.01); *H01L 21/6708* (2013.01); *H01L 21/6715* (2013.01); *H01L 21/67051* (2013.01)

(58) Field of Classification Search
CPC ..................... H01L 21/67051; H01L 21/6704; H01L 21/67028; H01L 21/67034; H01L 21/67017; H01L 21/02041; H01L 21/02052; H01L 21/02054
See application file for complete search history.

(56) References Cited

U.S. PATENT DOCUMENTS

| | | | |
|---|---|---|---|
| 2003/0098040 A1* | 5/2003 | Nam et al. ...................... | 134/1.3 |
| 2006/0042664 A1* | 3/2006 | Hardikar ................... | B08B 3/02 134/31 |
| 2007/0131256 A1* | 6/2007 | Nanba et al. .................... | 134/33 |
| 2007/0267047 A1* | 11/2007 | Hori ........................ | B08B 3/024 134/33 |

FOREIGN PATENT DOCUMENTS

| | | |
|---|---|---|
| JP | 2001-053051 A | 2/2001 |
| JP | 2005-327936 A | 11/2005 |
| JP | 2011-014935 A | 1/2011 |
| WO | 2005/050724 A1 | 6/2005 |

* cited by examiner

*Primary Examiner* — Michael Kornakov
*Assistant Examiner* — Ryan Coleman
(74) *Attorney, Agent, or Firm* — Pearne & Gordon LLP

(57) ABSTRACT

A surface of a substrate can be dried cleanly after liquid-processed by a liquid processing method and a liquid processing apparatus. The liquid processing method includes forming a liquid film of a rinse solution on an entire surface of a substrate having thereon a hydrophobic region by supplying, onto a central portion of the surface of the substrate, the rinse solution for rinsing a chemical liquid supplied on the substrate at a first flow rate while rotating the substrate at a first rotation speed; forming a stripe-shaped flow of the rinse solution on the surface of the substrate by breaking the liquid film formed on the entire surface of the substrate; and moving a discharge unit configured to supply the rinse solution toward a periphery of the substrate until the stripe-shaped flow of the rinse solution is moved outside the surface of the substrate.

6 Claims, 6 Drawing Sheets

LIQUID PROCESSING METHOD AND LIQUID PROCESSING APPARATUS

CROSS-REFERENCE TO RELATED APPLICATION

This application claims the benefit of Japanese Patent Application No. 2011-088370 filed on Apr. 12, 2011, the entire disclosures of which are incorporated herein by reference.

FIELD OF THE INVENTION

The present disclosure relates to a liquid processing method and a liquid processing apparatus for performing a liquid process on a substrate such as a semiconductor wafer or a glass substrate for a flat panel display.

BACKGROUND OF THE INVENTION

In a manufacturing process of a semiconductor device or a flat panel display (FPD), a cleaning process is performed to remove particles or contaminants adhering to a substrate such as a semiconductor wafer or a glass substrate. As a liquid processing apparatus for performing the cleaning process, there is known a single-wafer processing apparatus configured to hold and rotate a substrate such as a semiconductor wafer on a spin chuck and process the substrate by supplying a processing solution to the substrate.

There has been proposed a method of using an inert gas nozzle for supplying an inert gas to the substrate as well as using a pure water nozzle for supplying pure water (see, Patent Document 1).

Patent Document 1: Japanese Patent Laid-open Publication No. 2001-53051

In the disclosure of Patent Document 1, while supplying the pure water to a surface of the substrate from the pure water nozzle and jetting the inert gas to the surface of the surface from the inert gas nozzle located closer to a center of the substrate than the pure water nozzle, the pure water nozzle and the inert gas nozzle are moved toward a periphery of the substrate from a central portion thereof. Accordingly, a pure water film formed on the surface of the substrate by the rotation of the substrate after the pure water supplied from the pure water nozzle is expelled by the inert gas jetted from the inert gas nozzle. Accordingly, a dry region is expanded from the central portion of the substrate toward the periphery thereof in a substantially concentric shape.

When the pure water film is expanded in an annular shape, however, if minute water drops remain on the surface of the substrate, the remaining minute water drops may not be removed by the inert gas but may be dried. In such a case, it becomes difficult to reduce generation of water marks sufficiently. Since patterns formed on the substrate are miniaturized as semiconductor integrated circuits are highly integrated, generation of these water marks is deemed to be a problem.

BRIEF SUMMARY OF THE INVENTION

In view of the foregoing problems, illustrative embodiments provide a liquid processing method and a liquid processing apparatus capable of drying a liquid-processed surface of a substrate cleanly.

In accordance with one aspect of an illustrative embodiment, there is provided a liquid processing method. The liquid processing method includes forming a liquid film of a rinse solution on an entire surface of a substrate having thereon a hydrophobic region by supplying, onto a central portion of the surface of the substrate, the rinse solution for rinsing a chemical liquid supplied on the substrate at a first flow rate while rotating the substrate at a first rotation speed; forming a stripe-shaped flow of the rinse solution on the surface of the substrate by breaking the liquid film formed on the entire surface of the substrate; and moving a discharge unit configured to supply the rinse solution toward a periphery of the substrate until the stripe-shaped flow of the rinse solution is moved outside the surface of the substrate.

In accordance with another aspect of an illustrative embodiment, there is provided a liquid processing apparatus. The liquid processing apparatus includes a substrate rotation unit configured to hold and rotate a substrate having thereon a hydrophobic region; a rinse solution discharge unit configured to supply, onto the substrate held by the substrate rotation unit, a rinse solution for rinsing a chemical liquid supplied on the substrate; and a controller. The controller configured to control the substrate rotation unit and the rinse solution discharge unit to supply the rinse solution on a central portion of a surface of the substrate from the rinse solution discharge unit at a first flow rate while rotating the substrate by the substrate rotation unit at a first rotation speed; supply the rinse solution from the rinse solution discharge unit at a second flow rate lower than the first flow rate while rotating the substrate by the substrate rotation unit at a second rotation speed lower than the first rotation speed; and move the rinse solution discharge unit toward a periphery of the substrate until the rinse solution discharge unit is moved outside the surface of the substrate.

In accordance with an illustrative embodiment, there are provided a liquid processing method and a liquid processing apparatus capable of drying a liquid-processed surface of a substrate cleanly.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
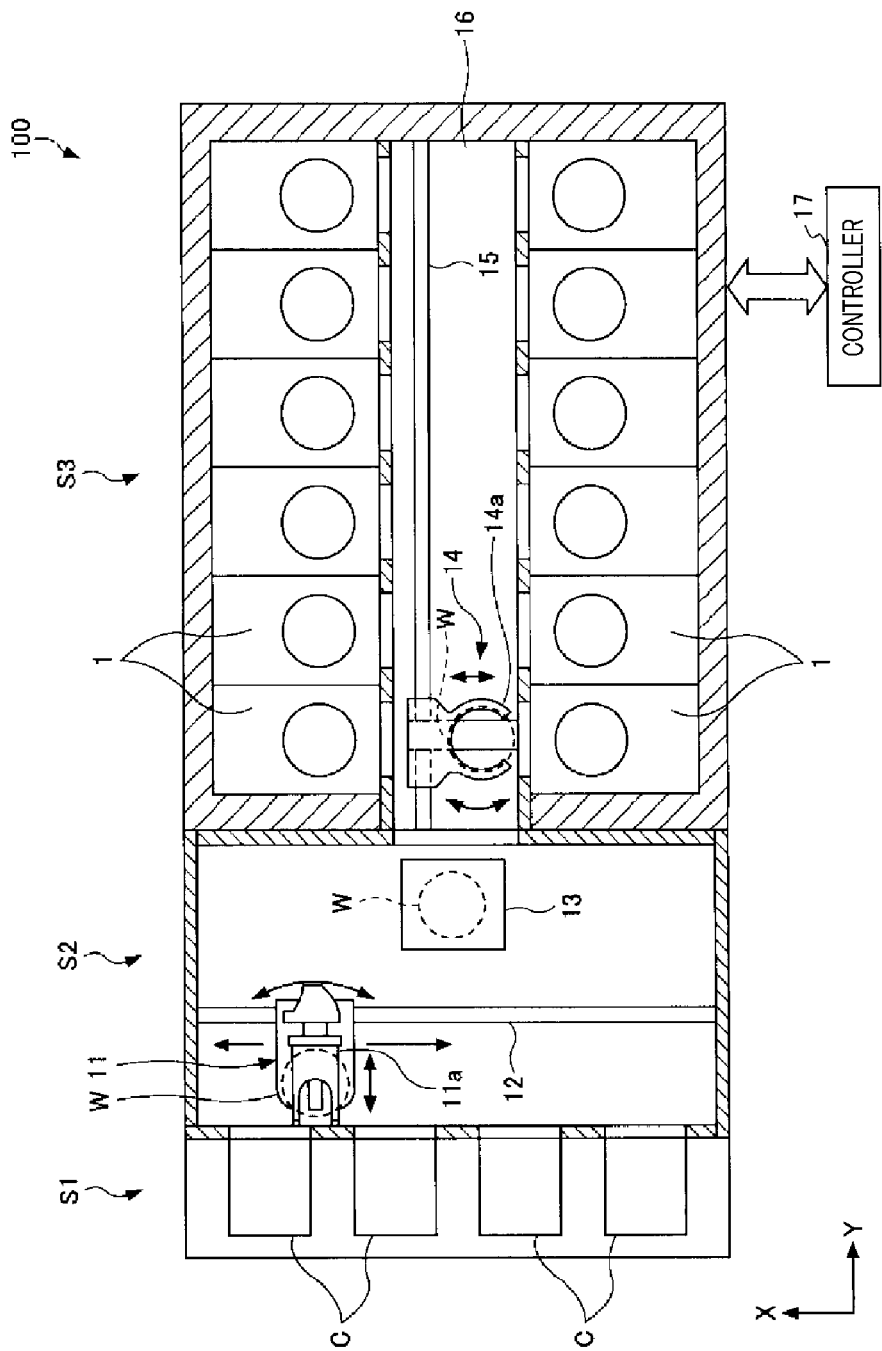
FIG. 1 is a schematic top view of a substrate processing apparatus in accordance with an illustrative embodiment.

Hereinafter, non-limiting illustrative embodiments will be described in detail with reference to the accompanying drawings. Through the drawings, same or corresponding elements or components will be assigned same or corresponding reference numerals, and redundant description thereof will be omitted. Further, values specified below are nothing more than examples and can be appropriately adjusted when the illustrative embodiments are implemented.

Referring to FIG. 1, a substrate processing apparatus including a liquid processing apparatus in accordance with an illustrative embodiment will be explained. FIG. 1 is a top view schematically illustrating the substrate processing apparatus in accordance with the illustrative embodiment. As shown in the figure, the substrate processing apparatus 100 includes a carrier station S1, a loading/unloading station S2 and a liquid processing station S3. The carrier station S1 mounts thereon a multiple number of (four in the shown example) wafer carriers C for accommodating therein a multiple number of wafers W. The loading/unloading station S2 transfers wafers W between the carrier station S1 and the liquid processing station S3 to be described later. The liquid processing station S3 has a liquid processing apparatus 1 therein.

The loading/unloading station S2 includes a transfer device 11. The transfer device 11 unloads a wafer W from a wafer carrier C and mounts the wafer W on a transit stage 13. Further, the transfer device 11 lifts up the wafer W from the transit stage 13 and loads the wafer W into the wafer carrier C. The transfer device 11 has a holding arm 11a for holding the wafer W thereon. The transfer device 11 can be moved along a guide 12 elongated in an arrangement direction (X direction in FIG. 1) of the wafer carriers C. Further, the transfer device 11 is capable of moving the holding arm 11a in a direction (Y direction in FIG. 1) orthogonal to the X direction and in a vertical direction. Further, the transfer device 11 can also rotate the holding arm 11a on a horizontal plane.

The liquid processing station S3 includes a transfer chamber 16 elongated in the Y direction and a multiple number of liquid processing apparatuses 1 arranged at both opposite sides of the transfer chamber 16. The transfer chamber 16 includes a transfer device 14, and the transfer device 14 has a holding arm 14a for holding the wafer W thereon. The transfer device 14 can be moved along a guide 15 provided in the transfer chamber 16 and elongated in the Y direction. Further, the transfer device 14 is capable of moving the holding arm 14a in the X direction and also capable of rotating the holding arm 14a on a horizontal plane. The transfer device 14 transfers the wafer W between the transit stage 13 within the loading/unloading station S2 and each liquid processing apparatus 1.

Further, the substrate processing apparatus 100 includes a controller 17 configured to control various components and elements of the substrate processing apparatus 100. Under the control of the controller 17, the substrate processing apparatus 100 is operated, whereby a substrate processing method to be described later, for example, is implemented.

In the substrate processing apparatus 100 having the above-described configuration, a wafer W is taken out of a wafer carrier C mounted on the carrier station S1 by the transfer device 11 and mounted on the transit stage 13. Then, the wafer W on the transit stage 13 is loaded into the liquid processing apparatus 1 by the transfer device 14 within the liquid processing station S3. In the liquid processing apparatus 1, a surface of the wafer W is cleaned by a certain cleaning solution, e.g., pure water, and then is dried. After the surface of the wafer W is dried, the wafer W is returned back into the wafer carrier C in the reverse sequence as it is loaded. While a single wafer W is being cleaned, other wafers W are transferred into other liquid processing apparatuses 1 in sequence and cleaned therein.

Figure 2:
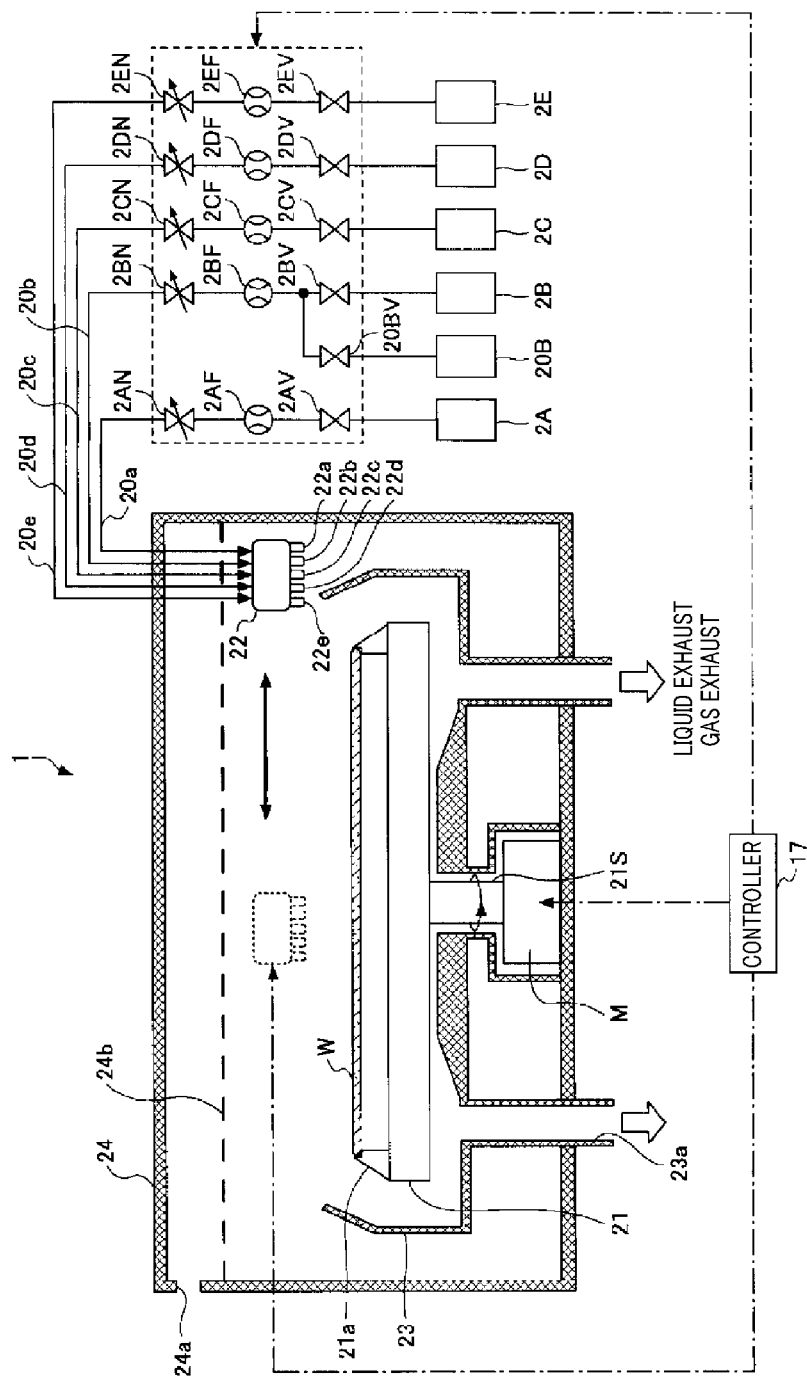
FIG. 2 is a schematic side view of a liquid processing apparatus that can be mounted in the substrate processing apparatus of FIG. 1.

Now, the aforementioned liquid processing apparatus 1 will be discussed with reference to FIG. 2. FIG. 2 is a side view schematically illustrating the liquid processing apparatus 1. As shown in the figure, the liquid processing apparatus 1 includes a wafer rotation unit 21, a nozzle block 22 and a cup 23. The wafer rotation unit 21 supports and rotates the wafer W. The nozzle block 22 holds a multiple number of discharge units configured to supply a fluid onto the wafer W supported by the wafer rotation unit 21. The cup 23 receives a chemical liquid and a rinse solution dispersed from the wafer W rotated by the wafer rotation unit 21. The wafer rotation unit 21, the nozzle block 22 and the cup 23 are accommodated in a housing 24. The housing 24 is provided with an inlet opening 24a through which a clean gas is introduced from a non-illustrated air conditioning system. The clean gas introduced into the housing 24 flows toward the cup 23 through a punch grille 24b provided in an upper region within the housing 24. In this configuration, the wafer W is cleaned and dried in a clean atmosphere.

A multiple number of wafer support members 21a are provided on the wafer rotation unit 21, and the wafer W is supported by the wafer support members 21a. Further, a rotation shaft 21s is coupled to a central portion of a bottom surface of the wafer rotation unit 21. The rotation shaft 21s is connected with a motor M. With this configuration, the wafer W supported by the wafer rotation unit 21 can be rotated.

Figure 3:
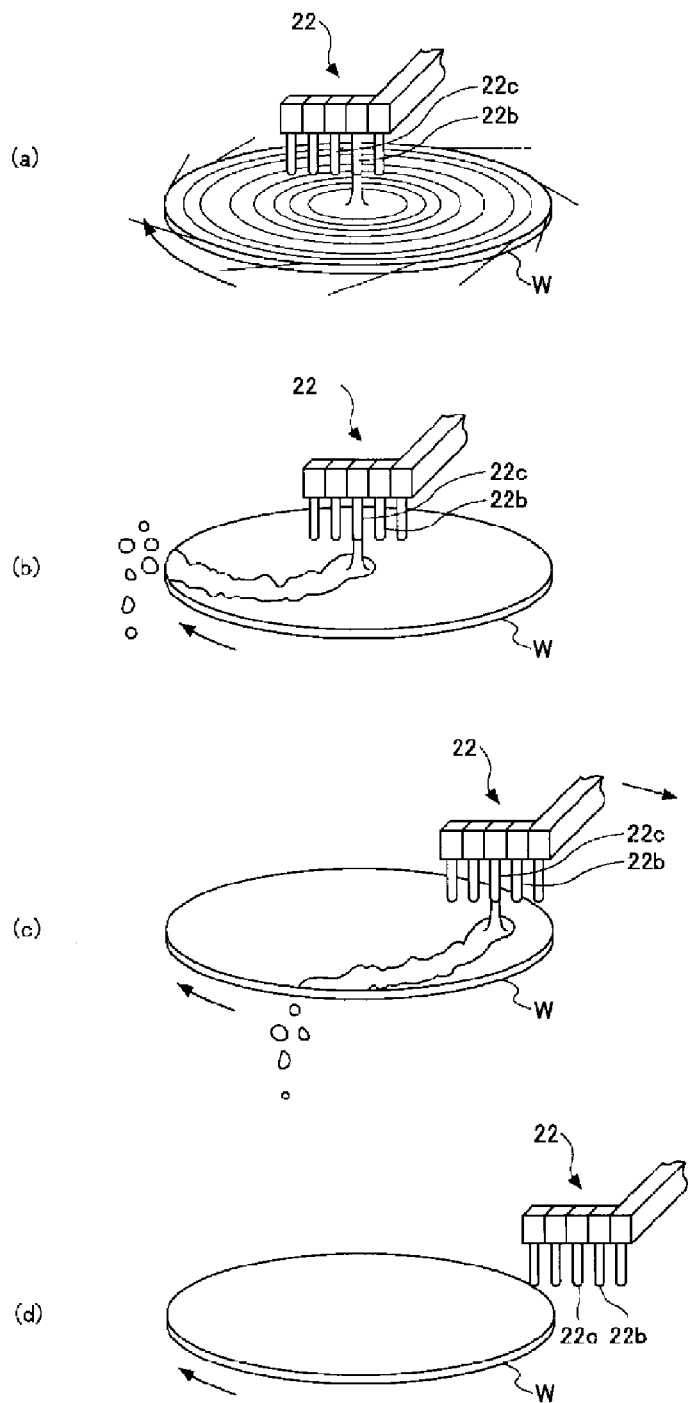
FIG. 3 is a schematic diagram for describing a liquid processing method in accordance with the illustrative embodiment.

The nozzle block 22 is supported by an arm (see FIG. 3) so as to be positioned above the cup 23 and the wafer W supported by the wafer rotation unit 21. The nozzle block 22 can be moved between a position (home position) outside the cup 23 and a central position (supply position) above the wafer W. In FIG. 2, the nozzle block 22 located at the home position is indicated by a solid line, and the nozzle block 22 located at the supply position is marked by a dashed line.

The nozzle block 22 includes, e.g., five discharge units, as in the shown example. To elaborate, the nozzle block 22 includes a water-repellent processing solution discharge unit 22a, a processing solution discharge unit 22b, a low flow rate rinse solution discharge unit 22c, a gas discharge unit 22d and an IPA (isopropyl alcohol) discharge unit 22e. Supply lines 20a to 20e respectively corresponding to the discharge units 22a to 22e are connected to the nozzle block 22. When the nozzle block 22 is located at the aforementioned supply position, the discharge units 22a to 22e are positioned above the central portion of the wafer W.

The supply line 20a is connected to a supply source 2A for supplying a water-repellent processing solution for processing the wafer W such that the wafer W becomes repellent against a rinse solution. The water-repellent processing solution is supplied onto the surface of the wafer W from the water-repellent processing solution discharge unit 22a. A needle valve 2AN, a flowmeter 2AF and an opening/closing value 2AV are provided on the supply line 20a. The water-repellent processing solution is supplied toward the water-repellent processing solution discharge unit 22a while its flow rate is controlled by the needle valve 2AN, the flowmeter 2AF and the opening/closing value 2AV. By way of example, the water-repellent processing solution may be, but not limited to, a silylating agent such as trimethylsilyldimethylamine (TMSDMA), dimethylsilyldimethylamine (DMSDMA), hexamethyldisilazane (HMDS) or 1,1,3,3-tetramethyldisilazane (TMDS), a surfactant or a fluorine polymer solution.

The supply line 20b is connected to supply sources 2B and 20B for supplying processing solutions. In the present illustrative embodiment, the supply source 2B may supply either one of a cleaning solution or an etching solution as a processing solution. By way of non-limiting example, SC1 ($NH_4OH+H_2O_2+H_2O$) or SC2 ($HCl+H_2O_2+H_2O$) may be used as the cleaning solution, and hydrofluoric acid (HF), buffered hydrofluoric acid (BHF) or $HNO_3$ may be used as the etching solution. Further, the supply source 20B may supply pure water as a processing solution. By way of example, the pure water supplied from the supply source 20B may be used as a cleaning solution for removing particles on the surface of the wafer W or may be used as a rinse solution for washing away the cleaning solution or the etching solution.

An opening/closing valve 2BV is provided at a downstream side of the supply source 2B, and an opening/closing valve 20BV is provided at a downstream side of the supply source 20B. By opening either one of the opening/closing valves 2BV or 20BV, the processing solution or the pure water can be supplied onto the surface of the wafer W. A needle valve 2BN and a flowmeter 2BF are provided on the supply line 20b, and the processing solution or the pure water is supplied toward the processing solution discharge unit 22b while their flow rates are controlled by the needle valve 2BN and the flowmeter 2BF.

The supply line 20c is connected to a supply source 2C for supplying pure water (or deionized water, the same as follows). Accordingly, the pure water can be supplied as a rinse solution onto the surface of the wafer W from the low flow rate rinse solution discharge unit 22c. A needle valve 2CN, a flowmeter 2CF and an opening/closing valve 2CV are provided on the supply line 20c. By opening the opening/closing valve 2CV, pure water is supplied from the supply source 2C onto the surface of the wafer W through the low flow rate rinse solution discharge unit 22c while its flow rate is controlled by the needle valve 2CN. Then, by closing the opening/closing valve 2CV, the supply of the pure water is stopped.

In the present illustrative embodiment, the needle valves 2BN and 2CN are controlled such that the flow rate of the pure water flowing in the supply line 20c becomes lower than the flow rate of the pure water flowing in the supply line 20b. In view of this difference in the flow rates of the pure water, an opening diameter of the low flow rate rinse solution discharge unit 22c is set to be smaller than an opening diameter of the processing solution discharge unit 22b.

The supply line 20d is connected to a supply source 2D for supplying an inert gas. Accordingly, the inert gas is supplied onto the surface of the wafer W from the gas discharge unit 22d. A needle valve 2DN, a flowmeter 2DF and an opening/closing valve 2DV are provided on the supply line 20d. The inert gas is supplied toward the gas discharge unit 22d while its flow rate is controlled by the needle valve 2DN, the flowmeter 2DF and the opening/closing valve 2DV. By way of non-limiting example, the inert gas may be a rare gas such as a nitrogen gas or an argon (Ar) gas. In the following description, a nitrogen gas is used as the inert gas, for example.

The supply line 20e is connected to a supply source 2E for supplying IPA. Accordingly, the IPA can be supplied onto the surface of the wafer W from the IPA discharge unit 22e. A needle valve 2EN, a flowmeter 2EF and an opening/closing valve 2EV are provided on the supply line 20e. The IPA is supplied toward the IPA discharge unit 22e while its flow rate is controlled by the needle valve 2EN, the flowmeter 2EF and the opening/closing valve 2EV.

Further, on and off operations of the motor M and a rotation speed of the motor M, movement of the nozzle block 22, opening/closing operation of the opening/closing valves 2AV to 2EV, and so forth are controlled by the controller 17.

Hereinafter, a liquid processing method in accordance with an illustrative embodiment performed by the liquid processing apparatus 1 will be explained with reference to FIGS. 1 to 4. First, a wafer W is loaded into the housing of the liquid processing apparatus 1 through a wafer transfer port (not shown) formed at the housing 24. Then, the wafer W is transferred onto the wafer rotation unit 21 by a non-illustrated lift pin.

(Supply of Processing Solution)

Subsequently, the nozzle block 22 is moved such that the processing solution discharge unit 22b is positioned above a central portion of the wafer W. The wafer W is rotated at a preset rotation speed by the wafer rotation unit 21. Further, by opening the opening/closing valve 2BV while the opening/closing valve 20BV is kept closed, a processing solution is supplied from the processing solution discharge unit 22b onto a surface of the wafer W. The supplied processing solution is diffused as a liquid film on the entire surface of the wafer W due to the rotation of the wafer W, so that a liquid process is performed on the surface of the wafer W.

(Rinse of Processing Solution by Pure Water)

After a preset time elapses, by closing the opening/closing valve 2BV, the supply of the processing solution is stopped. Further, by opening the opening/closing valve 20BV, pure water is supplied onto the surface of the wafer W from the processing solution discharge unit 22b above the central portion of the wafer W. The supplied pure water flows on the entire surface of the wafer W as a liquid film due to the rotation of the wafer W, so that the processing solution remaining on the surface of the wafer W is rinsed.

(Substitution of Pure Water with IPA)

After the processing solution is sufficiently rinsed by the pure water, by closing the opening/closing valve 20BV, the supply of the pure water is stopped. The nozzle block is moved such that the IPA discharge unit 22e is positioned above the central portion of the wafer W. By opening the opening/closing valve 2EV, IPA is supplied onto the surface of the wafer W from the IPA discharge unit 22e. The supplied IPA flows on the entire surface of the wafer W as a liquid film, and the pure water remaining on the surface of the wafer W is substituted with the IPA.

(Water-Repellent Process)

Thereafter, by closing the opening/closing valve 2EV, the supply of the IPA is stopped. Then, the nozzle block 22 is moved such that the water-repellent processing solution discharge unit 22a is positioned above the central portion of the wafer W. Then, by opening the opening/closing valve 2AV, a water-repellent processing solution is supplied onto the surface of the wafer W from the water-repellent processing solution discharge unit 22a. Since the water-repellent processing solution has solubility of the IPA, the water-repellent processing solution is mixed with the IPA remaining on the surface wafer W. At the same time, the IPA is flown toward a periphery of the wafer W due to the rotation of the wafer W. Accordingly, the water-repellent processing solution is diffused on the entire surface of the wafer W as a liquid film, so that the surface of the wafer W becomes water-repellent.

(Substitution of Water-Repellent Processing Solution with IPA)

Subsequently, by closing the opening/closing valve 2AV, the supply of the water-repellent processing solution is stopped. Then, the nozzle block 22 is moved such that the IPA discharge unit 22e is positioned above the central portion of the wafer W. By opening the opening/closing valve 2EV, IPA is supplied from the IPA discharge unit 22e onto the surface of the wafer W. The supplied IPA flows on the entire surface of the wafer W as a liquid film, and the water-repellent processing solution on the surface of the wafer W is substituted with the IPA.

(Rinse of IPA by Pure Water)

Afterwards, by closing the opening/closing valve 2EV, the supply of the IPA is stopped, and by opening the opening/closing valve 20BV, pure wafer is supplied from the processing solution discharge unit 22b onto the surface of the wafer W. As shown in FIG. 3(a), the supplied pure water flows on the entire surface of the wafer W as a liquid film due to the rotation of the wafer W. Accordingly, the IPA on the surface of the wafer W is rinsed by the pure water. At this time, in order to effectively rinse the IPA by rapidly flowing the pure water to the periphery of the wafer W, the wafer W needs to be rotated at a high speed. Desirably, a rotation speed of the wafer W may be set to be about 1500 rpm. Meanwhile, in order to prevent water marks caused by minute water drops from being formed on the wafer W, the liquid film of pure water needs to be formed on the entire surface of the wafer W while preventing the surface of the wafer W from being dried during the process. Accordingly, in order to form the liquid film of pure water on the entire surface of the wafer W rotated at the high speed, the pure water of a high flow rate is supplied from the processing solution discharge unit 22b. Desirably, a flow rate of the pure water supplied to the surface of the wafer W may be set to be, e.g., about 2 L/min.

(Drying Process)

Figure 4:
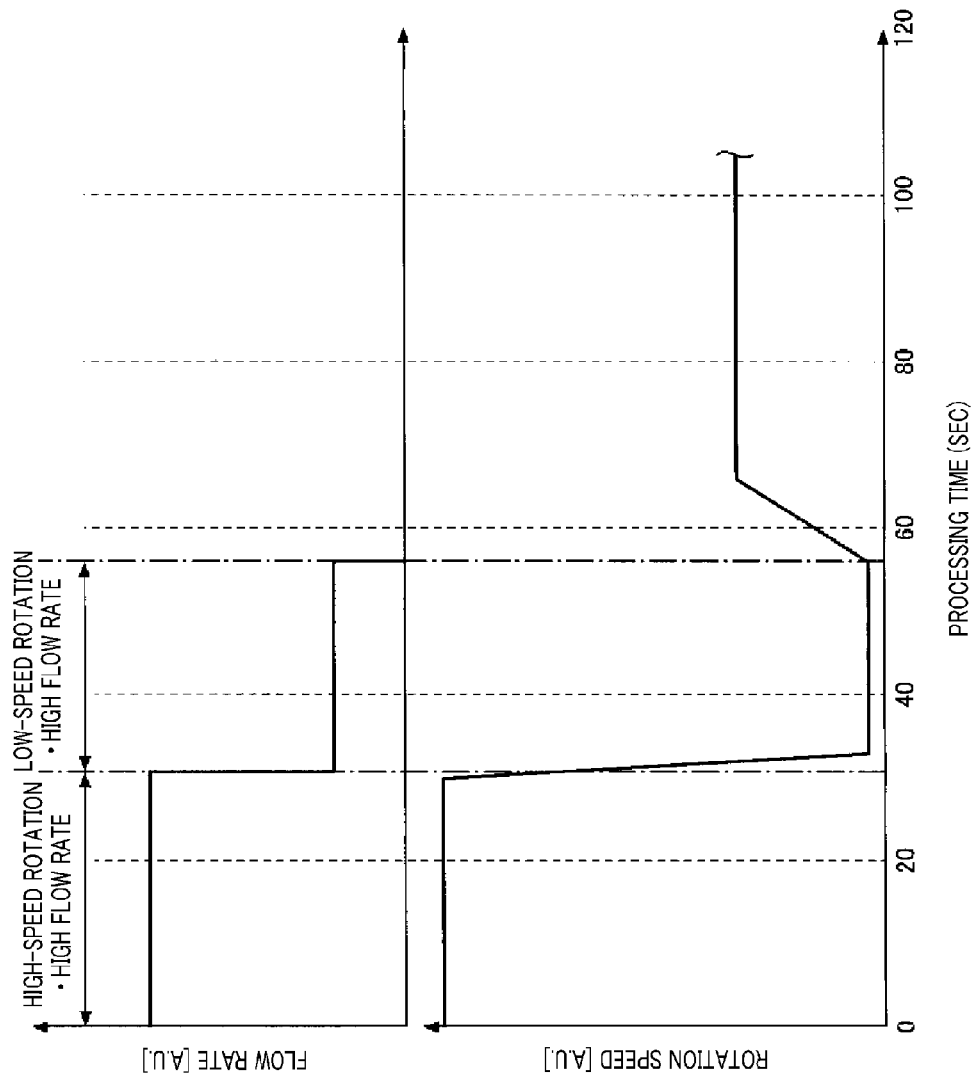
FIG. 4 is a time chart showing a substrate rotation speed and a rinse solution supply amount in the liquid processing method in accordance with the illustrative embodiment.

Thereafter, the rotation speed of the motor M is reduced, whereby, as shown in FIG. 4, the rotation speed of the wafer W is also decreased. By closing the opening/closing valve 2BV, the supply of the pure water from the processing gas discharge unit 22b is stopped. The nozzle block 22 is moved such that the low flow rate rinse solution discharge unit 22c is positioned above the central portion of the wafer W, and the opening/closing valve 2CV is opened. Since the flow rate of the pure water flowing in the supply line 20c is controlled to be lower than the flow rate of the pure water flowing in the supply line 20b, the pure water is supplied as a rinse solution onto the surface of the wafer W from the low flow rate rinse solution discharge unit 22c at a flow rate lower than the flow rate of the pure water discharged from the processing solution discharge unit 22b (see, FIG. 3(b)). At this time, the liquid film formed on the entire surface of the wafer W may not be maintained but broken. The rotation speed of the wafer W and the flow rate of the pure water from the low flow rate rinse solution discharge unit 22c are controlled. As a result, the pure water supplied from the low flow rate rinse solution discharge unit 22c onto the surface of the wafer W flows locally in a stripe shape (or in a stream shape) on the surface of the wafer W, specifically, from the central portion of the wafer W toward the periphery thereof. When reducing the rotation speed of the wafer W, it may be desirable that the rotation speed is set to be equal to or lower than about 50 rpm, more desirably, about 20 rpm. Further, desirably, the flow rate of the pure water may be set to be, e.g., about 350 cm/min.

Subsequently, as depicted in FIG. 3(c), while supplying the pure water from the low flow rate rinse solution discharge unit 22c at the aforementioned flow rate, the nozzle block 22 is moved toward the periphery of the wafer W from the central portion thereof. As a result, the stripe-shaped flow of pure water flowing on the wafer W is also moved toward the periphery of the wafer W from the central portion thereof. At this time, minute water drops remaining on the surface of the wafer W after the liquid film formed on the entire surface of the wafer W is broken are absorbed into the stripe-shaped flow of pure water. If the nozzle block 22 is moved toward outside the periphery of the wafer W, the stripe-shaped flow of the pure water disappears from the surface of the wafer W, and the surface of the wafer W is dried. Then, by closing the opening/closing valve 2CV, the supply of the pure water from the low flow rate rinse solution discharge unit 22c is stopped.

(Drying by High Speed Rotation)

Thereafter, as illustrated in FIG. 3(d), by increasing the rotation speed of the wafer W, the pure water remaining on a rear surface of the wafer W and an end portion (bevel portion) thereof is dried. Further, since a flow rate and a flow velocity of air flowing on the surface of the wafer W are also increased with the rise of the rotation speed of the wafer W, the surface of the wafer W can be dried more effectively. At this time, the rotation speed of the wafer W just needs to be set to be higher than the rotation speed of the wafer W obtained when the pure water of the low flow rate is supplied from the low flow rate rinse solution discharge unit 22c. Further, it may be also possible to set the rotation speed of the wafer W to be higher than the rotation speed of the wafer obtained when the IPA is rinsed by the high flow rate of pure water.

In accordance with the liquid processing method of the present illustrative embodiment as described above, when rinsing the IPA by the pure water, since the high flow rate of pure water is supplied onto the surface of the wafer W rotated at the high speed, it is possible to form the liquid film of pure water on the entire surface of the wafer W while rinsing the IPA efficiently. Thereafter, since the flow rate of the pure water supplied onto the surface of the wafer W is set to be lower than the flow rate of the pure water for rinsing the IPA, the liquid film formed on the entire surface of the wafer W cannot be maintained but broken, and the supplied pure water flows locally on the surface of the wafer W in the stripe shape. At this time, by rotating the wafer W at the low speed, it is possible to prevent pure water dispersed off the wafer W from splashing in the cup 23 and adhering again to the wafer W. Here, there is a likelihood that minute water drops adheres to a surface region of the wafer where the pure water does not flow. However, since the flow of pure water in the stripe shape flows throughout the surface of the wafer W by the rotation of the wafer W, the minute water drops, if any, can be absorbed. Moreover, since the nozzle block 22 is moved from the central portion of the wafer W toward the periphery thereof, the flow of pure water in the stripe shape absorbs the minute water drops while flowing from the central portion of the wafer W toward the periphery thereof. Accordingly, most of the minute water drops on the surface of the wafer W are absorbed and hardly remain on the surface of the wafer W. Thus, it is possible to prevent water marks from being formed.

By way of example, if the supply of pure water is stopped and the surface of the wafer is dried by rotating the wafer after the liquid film is formed on the surface of the wafer by supplying the pure water onto the water rotated at the high speed, the liquid film on the surface of the wafer can be diffused uniformly (about in 360°) from the central portion of the wafer W toward the periphery thereof, and the wafer is dried starting from its central portion. When the pure water is diffused toward the periphery of the wafer, a small amount of pure water in the liquid film may remain on the surface of the wafer from the flow toward the periphery of the wafer, so that minute water drops may remain. As these water drops are dried, water marks are formed.

In accordance with the present illustrative embodiment, however, the minute water drops remaining on the surface of the wafer W after the liquid film of pure water formed on the surface of the wafer is broken are removed by being absorbed by the pure water flowing in the stripe shape. Accordingly, it is possible to prevent water marks from being formed. That is, as compared to a drying method in which a dry region is enlarged from the central portion of the wafer toward the periphery thereof by the rotation of the wafer, the liquid processing method in accordance with the present illustrative embodiment is deemed to have such an advantageous effect.

The rotation speed of the wafer W and the flow rate of the pure water may be adjusted so as to allow the pure water to flow on the surface of the wafer W in the stripe shape. The strip-shaped flow of pure water, however, need not be continuously extended from under the nozzle block 22 to the periphery of the wafer W. As stated above, as long as the minute water drops remaining on the surface of the wafer W can be absorbed during the rotation of the wafer W, the strip-shaped flow of pure water may be cut on the midway, and it may be also possible that a multiple number of liquid drops (an indeterminate form of liquid lump) flow on the surface of the wafer W continuously.

Moreover, if pure water is left at a position closer to the center of the wafer W than a position where the stripe-shaped flow of pure water moving toward the periphery of the wafer W is positioned, the remaining pure water may be dried, resulting in formation of water marks. Thus, it may be desirable to set the rotation speed of the wafer W and the flow rate of the pure water so as to prevent the pure water from remaining at the position closer to the center of the wafer W than the position where the position where the stripe-shaped flow of pure water is positioned.

From the same aspect, desirably, a moving speed of the nozzle block 22 may be set not to allow pure water to remain at the position closer to the center of the wafer W than the position where the stripe-shaped flow of pure water moving on the surface of the wafer W toward the periphery thereof is positioned. To be specific, desirably, the moving speed of the nozzle block 22 may be set to be about 7.5 mm/s. Further, while moving the nozzle block 22 from the central portion of the wafer W toward the periphery thereof, it may be desirable to vary the moving speed of the nozzle block 22. By way of example, the moving speed may be first set to be, e.g., about 7.5 mm/s and then may be reduced to, e.g., about 5 mm/s. Alternatively, the nozzle block 22 may start to move from the central portion of the wafer W at a moving speed of, e.g., about 7.5 mm, and, then, the moving speed of the nozzle block 22 may be gradually reduced to reach, e.g., about 5 mm/s at the periphery of the wafer W. On the contrary, it may be also possible to increase the moving speed of the nozzle block 22 from the central portion of the wafer W toward the periphery thereof.

In addition, the rotation speed of the nozzle block may be varied as the nozzle block 22 is moved. For example, when the nozzle block 22 is moved from the central portion of the wafer W toward the periphery thereof, the rotation speed of the wafer W may be gradually reduced. Since a linear velocity of the wafer W being rotated increases from the center toward the periphery thereof, by decreasing the rotation speed as the nozzle block 22 approaches the periphery of the wafer W, the flow velocity of the pure water flowing on the surface of the wafer W in the stripe shape can be made uniform from the central portion to the periphery portion of the wafer W. Accordingly, minute water drops remaining on the surface of the wafer W can be absorbed by the pure water that flows uniformly in the stripe shape.

Figure 5:
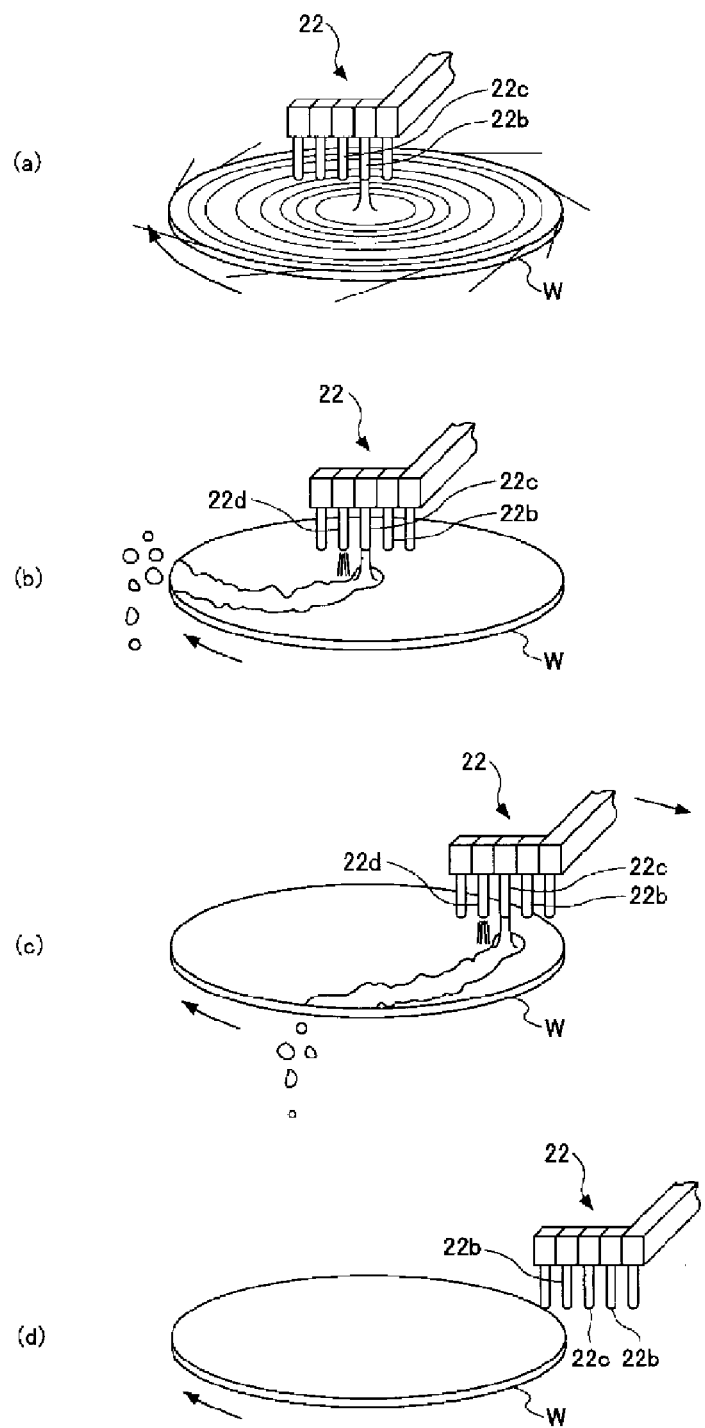
FIG. 5 is a schematic diagram for describing a modification example of the liquid processing method in accordance with the illustrative embodiment.

Now, a modification example of the liquid processing method in accordance with the illustrative embodiment will be described with reference to FIG. 5. In accordance with this modification example, the aforementioned processes from "supply of processing solution" to "rinse of IPA by pure water" are first performed.

Then, a rotation speed of the wafer W is reduced, and supply of pure water from the processing solution discharge unit 22b is stopped. Further, pure water is supplied by the low flow rate rinse solution discharge unit 22c to the surface of the wafer W from above the central portion of the wafer W (see FIG. 3(b)). The rotation speed of the wafer W and the flow rate of the pure water may be set as specified above. Further, as the pure water is supplied from the low flow rate rinse solution discharge unit 22c, a nitrogen gas is concurrently supplied to the surface of the wafer W from the gas discharge unit 22d of the nozzle block 22, as illustrated in FIG. 5(b).

Thereafter, as depicted in FIG. 5(c), while supplying the pure water from the low flow rate rinse solution discharge unit 22c and the nitrogen gas from the gas discharge unit 22d, the nozzle block 22 is moved toward the periphery of the wafer W. As the nozzle block 22 is moved outside the periphery of the wafer w, the pure water flowing in the stripe shape disappears from the surface of the wafer W, and the surface of the wafer W is dried. Here, a moving speed of the nozzle block 22 and a rotation speed (or variation thereof) of the wafer W may be set as described above.

Subsequently, as shown in FIG. 5(d), by rotating the wafer W at a high speed, a rear surface and an end portion of the wafer W are dried. Then, a liquid process of the wafer W is finished.

In this modification example, when the pure water is supplied onto the surface of the wafer W being rotated at a low speed from the low flow rate rinse solution discharge unit 22c at a low flow rate, the nitrogen gas is jetted to the surface of the wafer W from the gas discharge unit 22d located at a position closer to the center of the wafer W than the position where the low flow rate rinse solution discharge unit 22c is positioned. Due to this nitrogen gas, it becomes difficult for the pure water from the low flow rate rinse solution discharge unit 22c to diffuse to the central portion of the wafer W. Accordingly, it can be suppressed that pure water is left at the central portion of the wafer W and becomes water marks. Further, by jetting the nitrogen gas to the surface of the wafer w, the surface of the wafer W can be dried more effectively.

After starting the supply of the pure water from the low flow rate rinse solution discharge unit 22c, the nitrogen gas may be supplied after the nozzle block 22 is moved so as to locate the gas discharge unit 22d above the central portion of the wafer W. With this configuration, it is also possible to suppress diffusion of the pure water to the central portion of the wafer W. Further, in this way, it is possible to remove a liquid film, which is formed on the surface of the wafer W during the high-speed rotation from the central portion of the wafer W. Accordingly, local distribution of minute water drops on the surface of the wafer W can be suppressed, thereby reducing the likelihood of failure to absorb minute water drops.

Now, another modification example of the nozzle block 22 will be explained with reference to FIG. 6. FIG. 6(a) is a front view of the nozzle block 22 (a head portion thereof), and FIG. 6(c) is a side view of the nozzle block 22. FIG. 6(b) is a rear view corresponding to the front view of FIG. 6(a). As depicted in the figures, the water-repellent processing solution discharge unit 22a, the processing solution discharge unit 22b, the gas discharge unit 22d and the IPA discharge unit 22e are provided so as to be substantially orthogonal to the surface of the wafer W. However, the low flow rate rinse solution discharge unit 22c for supplying a small amount of pure water is inclined against the surface of the wafer W. To elaborate, in accordance with this modification example, when viewed from the top, the low flow rate rinse solution discharge unit 22c is provided to face outward along a radial direction RD (a direction orthogonal to a rotation direction A of the wafer W) of the wafer W and, also, to face a downstream side in the rotation direction of the wafer W, as depicted by a dashed line L in FIG. 6(d). Due to a rotation force of the wafer W and a centrifugal force by the rotation of the wafer W, the pure water supplied onto the surface of the wafer W from the low flow rate rinse solution discharge unit 22c tends to flow toward the periphery of the wafer W rather than flow in the direction orthogonal to the radial direction RD of the wafer W. The inclination of the low flow rate rinse solution discharge unit 22c only needs to be set to prevent the pure water from being discharged toward the central portion of the wafer W, and may be inclined in a direction orthogonal to the radial direction RD of the wafer W. If the low flow rate rinse solution discharge unit 22c is inclined as described above, the pure water can be supplied toward a flowing direction of the pure water on the surface of the wafer W. As a result, it is possible to prevent the pure water from being diffused toward the central portion of the wafer W.

While various aspects and embodiments have been described herein, other aspects and embodiments will be apparent to those skilled in the art. The various aspects and embodiments disclosed herein are for the purposes of illustration and are not intended to be limiting. Therefore, the true scope of the disclosure is indicated by the appended claims rather than by the foregoing description, and it shall be understood that all modifications and embodiments conceived from the meaning and scope of the claims and their equivalents are included in the scope of the disclosure.

By way of example, in the above-described embodiment, after processing the wafer W with the processing solution, water-repellent process is performed on the surface of the wafer W by supplying the water-repellent processing solution. However, the water-repellent process for supplying the water-repellent processing solution on the surface of the wafer W need not be necessarily performed. By way of example, the liquid processing method in accordance with the illustrative embodiment may also be applied to the case of performing a series of processes of supplying a processing solution to a substrate (wafer W) having a surface in which at least a part thereof is already water-repellent; rinsing the processing solution; and drying the substrate. Moreover, the liquid processing method in accordance with the illustrative embodiment may also be applied to the case of performing a series of processes of forming a photoresist film on a surface of a substrate, the surface having a region which is water-repellent; exposing the photoresist film to light; developing the photoresist film by supplying a developing solution as a processing solution; rinsing the developing solution with a rinse solution (e.g., pure water); and then drying the wafer W. In other words, the liquid processing method in accordance with the illustrative embodiment can be applied to the case of drying a substrate, on which a process by a chemical liquid such as a processing solution or a water-repellent processing solution is performed, after supplying a rinse solution to the substrate.

Further, it may be also possible to supply pure water to the surface of the wafer from the low flow rate rinse solution discharge unit 22c while switching a supply of the pure water at a high flow rate and at a low flow rate under the control of the controller 17. Here, a flow rate control valve capable of varying a flow rate of the pure water by inputting the electric signal may be used instead of the needle valve 2CN. Moreover, it may be also possible to vary a flow rate of the pure water from the supply source 20B by using the flow rate control valve instead of the needle valve 2BN. In these cases, the flow rate of the pure water may not be decreased in a step shape but be gradually decreased.

In addition, the low flow rate rinse solution discharge unit 22c may be inclined a downstream side in the rotation direction of the wafer W along a tangent direction (a direction orthogonal to a radial direction) of the wafer W, as depicted by a dashed dotted line of FIG. 6(d).

Figure 6:
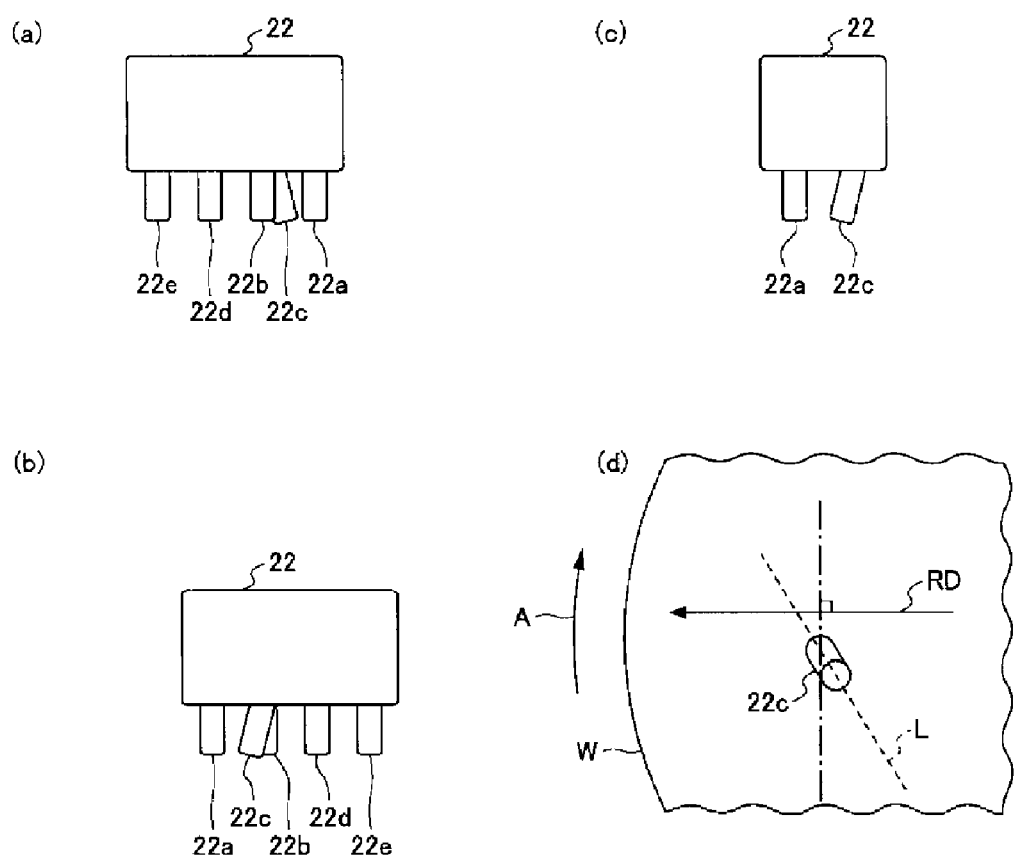
FIG. 6 is a diagram illustrating another modification example of a nozzle block of the liquid processing apparatus of FIG. 2.

Further, in the nozzle block 22, the gas discharge unit 22d for supplying an inert gas may also be inclined against the surface of the wafer W, like the low flow rate rinse solution discharge unit 22c shown in FIG. 6. To elaborate, when viewed from the top, the gas discharge unit 22d may be provided outward along the radial direction RD of the wafer W or may be provided to face the downstream side in the rotation direction A of the wafer W. By providing the gas discharge unit 22d to face outward along the radial direction RD, pure water on the surface of the wafer W can be flown outward more securely, so that the surface of the wafer W can be dried more effectively. Further, by providing the gas discharge unit 22d to face the downstream side in the rotation direction A of the wafer W, the inert gas can be supplied in a direction on which the pure water flows on the surface of the wafer W, without disturbing the flow of the pure water. Thus, it is possible to prevent the pure water from remaining on the surface of the wafer W.

In the above-described embodiment, although pure water is used as the rinse solution, dilute aqueous solution of hydrochloric acid (having a concentration of, e.g., about 0.1 wt %) may be used as the rinse solution.

Further, the rotation speed of the wafer W and the flow rate of the pure water may be reduced simultaneously, or the rotation speed of the wafer W may be reduced before the flow rate of the pure water is reduced.

Moreover, the liquid processing method in accordance with the illustrative embodiment is also applicable to, a glass substrate for a flat panel display as well as a semiconductor wafer.

What is claimed is:

1. A liquid processing apparatus comprising:
a substrate rotation unit configured to hold and rotate a substrate having thereon a hydrophobic region;
a rinse solution discharge unit configured to supply, onto the substrate held by the substrate rotation unit, a rinse solution for rinsing a chemical liquid supplied on the substrate, the rinse solution discharge unit including a first rinse solution discharge unit configured to supply the rinse solution at a first flow rate and a second rinse solution discharge unit configured to supply the rinse solution at a second flow rate; and
a programmable controller configured to control the substrate rotation unit and the rinse solution discharge unit to supply the rinse solution on a central portion of a surface of the substrate from the first rinse solution discharge unit at the first flow rate while rotating the substrate by the substrate rotation unit at a first rotation speed; supply the rinse solution from the second rinse solution discharge unit at the second flow rate lower than the first flow rate while rotating the substrate by the substrate rotation unit at a second rotation speed lower than the first rotation speed; and move the rinse solution discharge unit toward a periphery of the substrate while the rinse solution is supplied from the second rinse solution discharge unit and is not supplied from the first rinse solution discharge unit,
wherein the programmable controller is programmed to control the second flow rate and the second rotation speed such that the rinse solution supplied at the second flow rate flows in a stripe shape on the surface of the substrate from the central portion of the substrate toward the periphery thereof, and an opening diameter of the second rinse solution discharge unit is set to be smaller than an opening diameter of the first rinse solution discharge unit.

2. The liquid processing apparatus of claim 1, wherein the second rinse solution discharge unit is inclined against the surface of the substrate toward the periphery of the substrate along a radial direction of the substrate.

3. The liquid processing apparatus of claim 1, wherein the programmable controller is programmed to control the substrate rotation unit to rotate the substrate at a third rotation speed higher than the second rotation speed after the rinse solution discharge unit is moved outside the surface of the substrate.

4. The liquid processing apparatus of claim 1, further comprising:

a gas discharge unit configured to jet a gas and located at a position closer to a center of the substrate than a position where the second rinse solution discharge unit is positioned, wherein the programmable controller is programmed to control the rinse solution discharge unit such that the gas is jetted toward the surface of the substrate when the rinse solution discharge unit is moved toward the periphery of the substrate.

5. The liquid processing apparatus of claim 1, wherein the second rinse solution discharge unit is extended to be inclined toward the periphery of the substrate rather than in a tangent direction to a rotation direction of the substrate.

6. The liquid processing apparatus of claim 4, wherein the gas discharge unit is extended to be inclined toward the periphery of the substrate rather than in a tangent direction to the rotation direction of the substrate.

* * * * *